United States Patent
Meynants et al.

(10) Patent No.: US 11,930,288 B2
(45) Date of Patent: Mar. 12, 2024

(54) PIXEL DRIVE VOLTAGE GENERATION USING A CHARGE PUMP

(71) Applicant: ams Sensors Belgium BVBA, Antwerp (BE)

(72) Inventors: Guy Meynants, Antwerp (BE); Koen Ruythooren, Antwerp (BE); Pieter De Wit, Antwerp (BE)

(73) Assignee: AMS SENSORS BELGIUM BVBA, Antwerp (BE)

( * ) Notice: Subject to any disclaimer, the term of this patent is extended or adjusted under 35 U.S.C. 154(b) by 300 days.

(21) Appl. No.: 17/298,329

(22) PCT Filed: Nov. 28, 2019

(86) PCT No.: PCT/EP2019/082934
§ 371 (c)(1),
(2) Date: May 28, 2021

(87) PCT Pub. No.: WO2020/109479
PCT Pub. Date: Jun. 4, 2020

(65) Prior Publication Data
US 2022/0030187 A1    Jan. 27, 2022

(30) Foreign Application Priority Data

Nov. 30, 2018   (EP) .................................. 18209515
Dec. 5, 2018    (EP) .................................. 18210578

(51) Int. Cl.
*H04N 25/709* (2023.01)
*H01L 27/146* (2006.01)
(Continued)

(52) U.S. Cl.
CPC ..... *H04N 25/709* (2023.01); *H01L 27/14612* (2013.01); *H01L 27/14643* (2013.01); *H04N 25/745* (2023.01); *H04N 25/772* (2023.01)

(58) Field of Classification Search
CPC .. H04N 25/709; H04N 25/745; H04N 25/772; H04N 25/74; H01L 27/14612; H01L 27/14643
See application file for complete search history.

(56) References Cited

U.S. PATENT DOCUMENTS 7,750,958 B1    7/2010   Dierickx
10,104,325 B2 * 10/2018  Choi ..................... H02M 3/07
(Continued)

FOREIGN PATENT DOCUMENTS

CN    102037722 A    4/2011
CN    104092962 A    10/2014
(Continued)

OTHER PUBLICATIONS

EP-670658-A2 (A charge storage device) NC Bird. (Sep. 1995). (Year: 1995).*
(Continued)

*Primary Examiner* — Yogesh K Aggarwal
(74) *Attorney, Agent, or Firm* — MH2 TECHNOLOGY LAW GROUP LLP

(57) ABSTRACT

An image sensor comprises an array comprising rows and columns of pixels, a first number N of connection lines connected to a first number N of pixels of the array, a voltage regulating circuit having an output, a first terminal, and a driver circuit. The driver circuit has a first number N of switches coupled to the first number N of connection lines and to the output of the voltage regulating circuit, and a first number N of further switches coupled to the first number N of connection lines and to the first terminal. The first number N is at least two.

17 Claims, 12 Drawing Sheets

(51) Int. Cl.
*H04N 25/71* (2023.01)
*H04N 25/772* (2023.01)

(56) References Cited

U.S. PATENT DOCUMENTS

| | | |
|---|---|---|
| 2004/0252211 A1 | 12/2004 | Rhodes |
| 2005/0269607 A1 | 12/2005 | Henderson |
| 2006/0001754 A1 | 1/2006 | Yanagisawa et al. |
| 2007/0146517 A1 | 6/2007 | Yu |
| 2009/0016084 A1 | 1/2009 | Trattler |
| 2011/0062310 A1 | 3/2011 | Kudo |
| 2012/0001056 A1 | 1/2012 | Fife et al. |
| 2013/0009043 A1 | 1/2013 | Mao et al. |
| 2014/0048686 A1 | 2/2014 | Johansson et al. |
| 2014/0085523 A1 | 3/2014 | Hynecek |
| 2015/0156413 A1 | 6/2015 | Do et al. |
| 2017/0013222 A1 | 1/2017 | Choi et al. |
| 2017/0094202 A1 | 3/2017 | Kobayashi et al. |

FOREIGN PATENT DOCUMENTS

| | | |
|---|---|---|
| CN | 106341041 A | 1/2017 |
| EP | 0670658 A2 | 9/1995 |
| EP | 1557887 A1 | 7/2005 |
| EP | 2280536 A1 | 2/2011 |
| EP | 3355459 A1 | 8/2018 |
| EP | 3410485 A1 | 12/2018 |

OTHER PUBLICATIONS

European Office Action in corresponding EP Application No. 18210578.3 dated Jun. 2, 2021, 7 pages.
International Search Report and Written Opinion dated Mar. 23, 2020 for corresponding International Application No. PCT/EP2019/082934, 16 pages.
Chinese Office Action dated May 24, 2023, Chinese Patent Application No. 201980088983X, 13 pages, with English translation.
Chinese Office Action dated Oct. 26, 2023, Chinese Patent Application No. 201980088983X, 13 pages, with English translation.

* cited by examiner

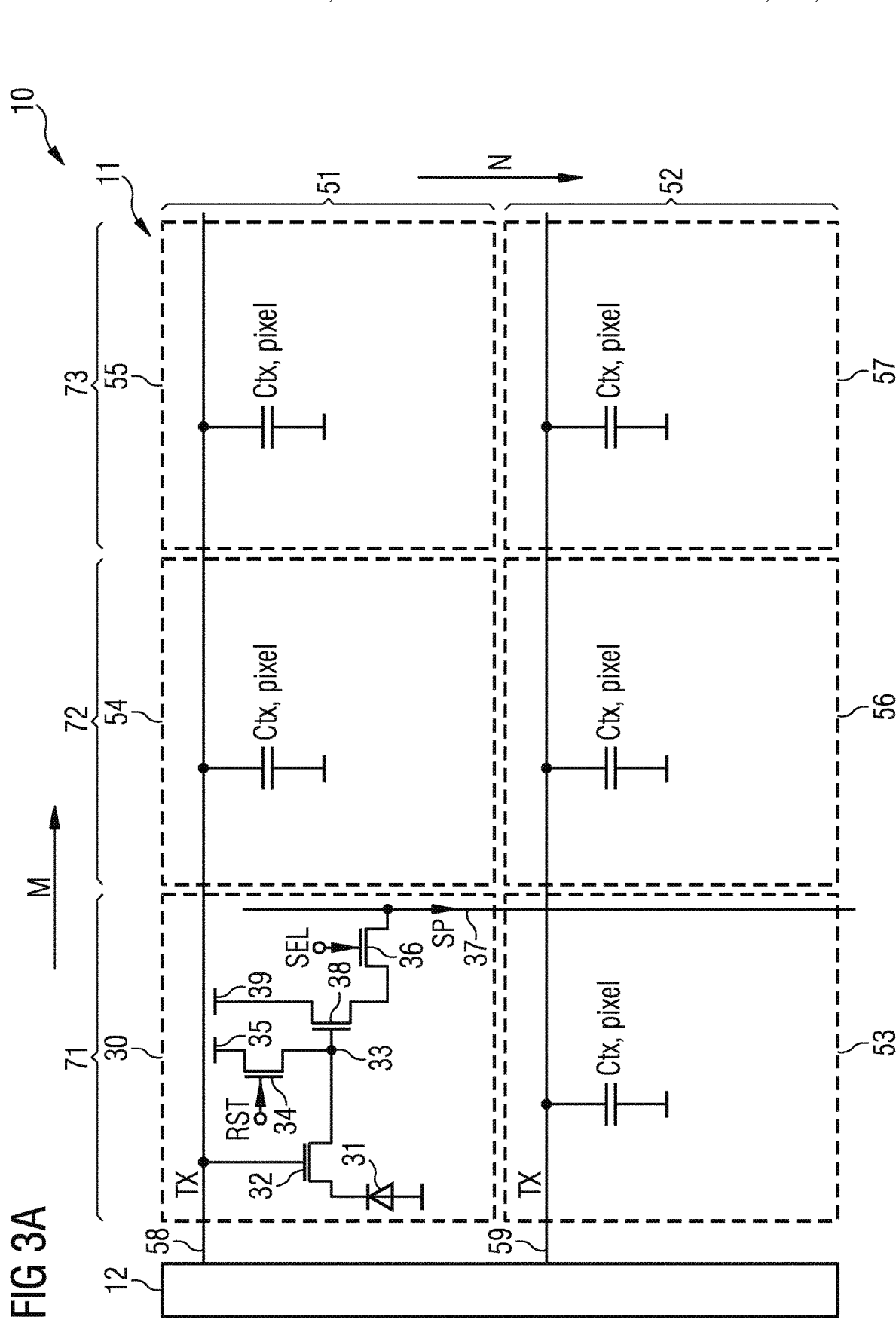

PIXEL DRIVE VOLTAGE GENERATION USING A CHARGE PUMP

CROSS-REFERENCE TO RELATED APPLICATIONS

The present application is the national stage entry of International Patent Application No. PCT/EP2019/082934, filed on Nov. 28, 2019, and published as WO 2020/109479 A1 on Jun. 4, 2020, which claims the benefit of priority of European Patent Application Nos. 18209515.8, filed on Nov. 30, 2018, and 18210578.3 filed on Dec. 5, 2018, all of which are incorporated by reference in their entirety herein.

FIELD

The present disclosure is related to an image sensor, a camera comprising the image sensor, an apparatus comprising the camera and a method for providing a voltage.

BACKGROUND

The image sensor comprises a plurality of pixels which are arranged in an array of columns and rows. A driver circuit of the image sensor is coupled to the pixels to provide a control or a supply voltage to transistors of the pixels. This voltage has to be provided in an efficient way to the pixels.

It is an object to provide an image sensor, a camera comprising the image sensor, an apparatus comprising the camera and a method for providing a voltage that efficiently drives pixels of an image sensor.

These objects are achieved by the subject-matter of the independent claims. Further developments and embodiments are described in the dependent claims.

SUMMARY

In an embodiment, an image sensor comprises an array comprising rows and columns of pixels, a first number N of connection lines connected to the first number N of pixels of the array, a voltage regulating circuit having an output, a first terminal and a driver circuit. The driver circuit comprises the first number N of switches coupled to the first number N of connection lines and to the output of the voltage regulating circuit. Moreover, the driver circuit comprises the first number N of further switches coupled to the first number N of connection lines and to the first terminal. The first number is at least two.

Advantageously, by the first number N of switches and the first number N of further switches, an output voltage provided by the voltage regulating circuit and a first terminal voltage tapped at the first terminal can selectively be provided via the first number N of connections lines to the first number N of pixels. For example, a single connection line of the first number N of connection lines or a few connection lines of the first number N of connection lines may be conductively connected to the first terminal, wherein at the same point of time the other connection lines of the first number N of connection lines are conductively connected to the output of the voltage regulating circuit.

Alternatively, the first number is at least three, at least four, at least ten, at least 100 or at least 1000.

In an embodiment, the image sensor is realized as a complementary metal-oxide-semiconductor, CMOS, image sensor. Advantageously, the CMOS image sensor can be designed for a high frame rate. Thus, a very rapid sequence of images may be captured. The CMOS image sensor can be configured to operate at low light and at high light conditions.

In an embodiment, the pixel comprises a photodiode, a transfer transistor, a sense node coupled to the photodiode via the transfer transistor, a reset transistor and a supply input coupled to the sense node via the reset transistor. The pixel is one of the first number N of pixels. In an example, each of the first number N of pixels may be realized such as the pixel.

In an embodiment, a connection line of the first number N of connection lines is connected to a control terminal of the transfer transistor. Thus, the control terminal of the transfer transistor is selectively conductively connected to the output of the voltage regulating circuit or to the first terminal. The first number N of connection lines are connected to control terminals of the transfer transistors of the first number of pixels. The control terminals of the transfer transistors of the first number of pixels either receive the output voltage or the first terminal voltage via the first number N of connection lines and the driver circuit.

In an alternative embodiment, a connection line of the first number N of connection lines is connected to a control terminal of the reset transistor. Thus, the control terminal of the reset transistor is selectively conductively connected to the output of the voltage regulating circuit or to the first terminal. The first number N of connection lines are connected to control terminals of the reset transistors of the first number of pixels. The control terminals of the reset transistors of the first number of pixels either receive the output voltage or the first terminal voltage via the first number N of connection lines and the driver circuit.

In an embodiment, a majority of the first number N of switches is set in a conducting state at any point of time during operation of the image sensor. Thus, a minority of the first number N of switches is set in a non-conducting state at this point of time during operation of the image sensor. Each connection line obtains a capacitance which may be a parasitic capacitance. Since the majority of the first number N of switches is conductively connected to the output of the voltage regulating circuit, the output voltage is stabilized by the sum of the capacitance values of the majority of the first number N of connections lines.

In an embodiment, the driver circuit comprises a control circuit configured to set the first number N of switches in a conducting state and the first number N of further switches in a non-conducting state in a first operation phase and to set a subset of the first number N of switches in a non-conducting state, the other of the first number N of switches in a conducting state, the subset of the first number N of further switches in a conducting state and the other of the first number N of further switches in a non-conducting state in a second operation phase. The second operation phase follows the first operation phase. The subset of the first number N of switches is equal to the minority mentioned above. The other of the first number N of switches is equal to the majority mentioned above.

In an embodiment, the subset may be one or a few. The subset may be every ith switch. The number i may be 3, 4, 5, 10 or 100. The number i may be more than 2 or more than 10 or more than 100.

In a further development, the control circuit is configured to set the first number N of switches in a conducting state and the first number N of further switches in a non-conducting state in a third operation phase. The third operation phase follows the second operation phase. Thus, the state of the switches and of the further switches is equal in the first and the third phase.

In an embodiment, the first number N of connection lines are at least temporarily configured as buffer capacitor of the voltage regulating circuit. Advantageously, the first number N of connection lines can perform low-pass filtering or stabilizing of the output voltage. Advantageously, the peak currents inside and at the output of the voltage regulating circuit can be reduced by the coupling of the first number N of connection lines to the output of the voltage regulating circuit.

In an embodiment, the first number N of connection lines are at least temporarily operable as buffer capacitor of the voltage regulating circuit. The first number N of connection lines operate at least temporarily as buffer capacitor of the voltage regulating circuit.

In an embodiment, the voltage regulating circuit comprises a charge pump. The charge pump generates the output voltage. The charge pump typically receives a supply voltage and a reference potential at its input side. Advantageously, the charge pump is able to generate the output voltage having a value that is outside of an interval between the supply voltage and the reference potential. Thus, the output voltage may be higher than the supply voltage and lower than the reference potential. The charge pump comprises a third number L of stages. The third number L may be 1, less than 3, less than 4 or more than 3. The charge pump includes an output connected to the output of the voltage regulating circuit.

In an embodiment, the image sensor comprises a multiplexer coupled to the array and a clock generator coupled to the charge pump and to the multiplexer. A clock signal generated by the clock generator is provided to the charge pump and to the multiplexer. Advantageously, a single clock generator is sufficient to operate the charge pump and the multiplexer. Thus, an area of the image sensor can be kept small.

In an embodiment, the image sensor comprises a reference potential terminal at which a reference potential can be tapped. The voltage regulating circuit is configured to generate an output voltage that is negative with respect to the reference potential. Advantageously, a subthreshold current of an n-channel field effect transistor, shorted n-FET, is diminished by reducing the control voltage at the control terminal of the n-FET below the reference potential.

In an embodiment, the image sensor comprises a supply terminal at which a supply voltage can be tapped. The voltage regulating circuit is configured to generate an output voltage that is positive with respect to the supply voltage. Advantageously, transistors of the pixels or other circuit parts of the image sensor can be operated with the output voltage being higher than the supply voltage. The first terminal may be coupled or connected to the supply terminal.

In an embodiment, the voltage regulating circuit is free of a discrete capacitor coupling the output of the voltage regulating circuit to a reference potential terminal. In general, a discrete capacitor could e.g. be realized as an external capacitor that is external of a semiconductor body of the image sensor and is coupled to the image sensor or as an internal capacitor on the semiconductor body of the image sensor. Such an internal capacitor would require area on the semiconductor body. Advantageously, the space for the realization of the image sensor can be kept small.

In an embodiment, the array comprises a second number M of columns. Thus, a row of the array comprises e.g. a second number M of pixels. The array comprises a first number N of rows. In an example, each row of the first number N of rows comprises the second number M of pixels.

In an embodiment, the first number N of connection lines run parallel to the first number N of rows. The driver circuit may be realized as a row driver circuit. One of the first number N of connections lines connects the driver circuit to a corresponding one of the first number N of rows of pixels.

In an embodiment, the image sensor comprises an analog-to-digital converter. A column line of the array is coupled via the multiplexer to the analog-to-digital converter. Each column comprises a column line. The array may comprise a second number M of column lines. In an example, the second number M of column lines may be coupled via the multiplexer to the analog-to-digital converter.

In an embodiment, the clock generator generates a clock signal that is provided to the charge pump and to the multiplexer.

In an embodiment, the array comprises a number P of pixels. The number P is at least two, at least three, at least four, at least ten, at least 100 or at least 1000.

In an embodiment, a camera comprises the image sensor and a lens attached to the image sensor. The small size of the image sensor is advantageous for a camera with small size.

In a further development, the camera comprises a further image sensor that is realized such as the image sensor. The camera is configured as a stereo vision system.

In an embodiment, an apparatus comprises the camera. The apparatus is realized as one of a group comprising an endoscope, a headset, an entrance control device, a home automation device, a robot and a mobile device.

In an embodiment, a method for providing a voltage comprises providing an output voltage by a voltage regulating circuit that is coupled via a first number N of switches of a driver circuit to the first number N of connection lines, and providing a first terminal voltage at a first terminal that is coupled via the first number N of further switches of the driver circuit to the first number N of connection lines. An image sensor comprises an array having rows and columns of pixels and the first number N of connection lines are connected to the first number N of pixels of the array.

Advantageously, the output voltage and the first terminal voltage can be selectively and/or alternately provided via the first number N of connections lines to the first number N of pixels by controlling the first number N of switches and the first number N of further switches.

The method for providing a voltage may be implemented e.g. by the image sensor according to one of the embodiments defined above.

In an embodiment, the image sensor uses a compact charge pump to generate a control voltage for a signal of a control line of a pixel array.

In an embodiment, a CMOS image sensor comprises a pixel array, composed of rows and columns of CMOS active pixels and control lines connected to a subset of the pixel array. At least one of the control lines is connected to two switches. At least one of the switches is connected to a common node. A voltage regulating circuit is connected to the common node.

In an embodiment, the pixel array is operated such that said control line is kept at the potential or an output voltage of the voltage regulating circuit for at least 90% of the control lines (by connecting the control switch of the control line to said common node).

In an embodiment, all control lines except one are kept at the potential or the output voltage of the voltage regulating circuit. The potential or the output voltage of the voltage regulating circuit may be realized as a regulated voltage.

In an embodiment, the voltage regulating circuit contains a charge pump or charge pump circuit.

In an embodiment, the output voltage of the voltage regulator circuit is below the ground voltage of the image sensor. The image sensor may be fabricated as a chip.

In an embodiment, the output voltage of the voltage regulating circuit is above the supply level of the image sensor.

In an embodiment, the image sensor is for use in CMOS image sensors (shorted CIS), in particular devices which have limited area for, such as CIS for a micro-camera module or a camera-on-tip endoscope. In particular, image sensors with small pixels which require a negative voltage on control lines benefit from the embodiment of the image sensor described above. Another use case is an image sensor where some of the control lines on the pixel array need to be pulsed at a voltage higher than the supply level.

For the image sensor for a micro-camera module, the available area for peripheral circuits is very limited. The image sensor enables the use of negative voltages on the transfer gate of small pixels. The image sensor can also be used to realize a larger format sensor. The area required for the voltage regulator or regulators is significantly scaled for any of the image sensors.

BRIEF DESCRIPTION OF THE DRAWINGS

The following description of figures of embodiments may further illustrate and explain aspects of the image sensor, the camera, the apparatus comprising the camera and the method for providing a voltage. Devices and circuit parts with the same structure and/or the same effect appear with equivalent reference symbols. In so far as devices or circuit parts correspond to one another in terms of their function in different figures, the description thereof is not repeated for each of the following figures. In the drawings:

FIGS. 3A and 3B show examples of a pixel array of an image sensor.

DETAILED DESCRIPTION

Figure 1:
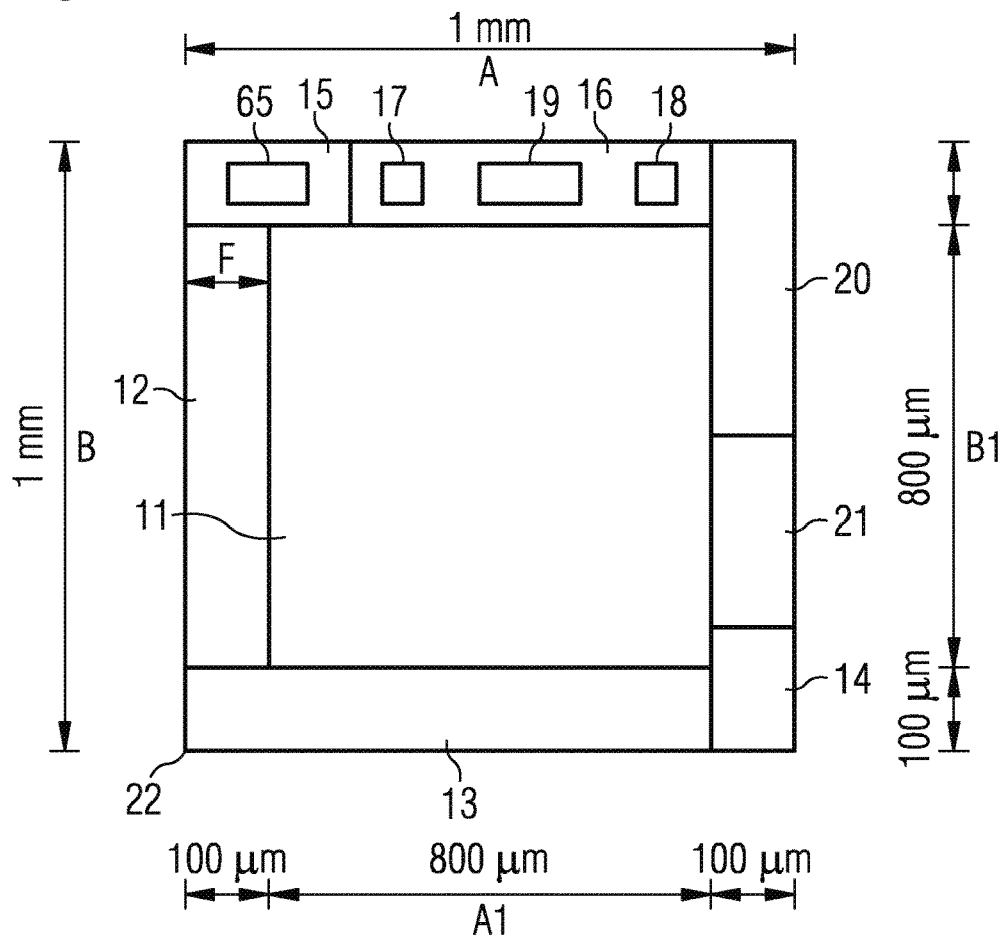
FIG. 1 shows an example of an image sensor.

FIG. 1 shows an example of an image sensor 10 that comprises an array 11 and a driver circuit 12. The array 11 is realized as a pixel array. The driver circuit 12 may implement a row driver circuit. Moreover, the image sensor 10 comprises a multiplexer 13 and an analog-to-digital converter 14. The image sensor 10 includes a voltage regulating circuit 15 with a charge pump 65. The voltage regulating circuit 15 may be realized as regulator. Additionally, the image sensor 10 comprises a terminal area 16 having a supply pad 17 and a ground pad 18. The terminal area 16 may also comprise an electrostatic discharge circuit 19 connected to the ground pad 18 and the supply pad 17. The supply pad 17 realizes a supply terminal 99 and the ground pad 18 implements a reference potential terminal 98. Furthermore, the image senor 10 includes an output driver circuit 20 and a clock generator 21.

In FIG. 1, a floorplan of the image sensor 10 is elucidated. The array 11 is in the middle of the image sensor 10. The image sensor 10 as shown in FIG. 1 is realized on a single semiconductor body 22. The array 11 and the further circuits described above are integrated on a first surface of the semiconductor body 22. The semiconductor body 22 may be realized as a chip or die. A rectangle of the image sensor 10 has a first side length A and a second side length B. The first side length A may be equal to the second side length B. The first and the second side length A, B may be out of an interval between 0.3 mm to 10 mm or between 0.5 mm to 2 mm. Alternatively, the first and the second side lengths A, B may be out of an interval from 0.8 mm to 1.5 mm. Alternatively, the first and the second side lengths A, B may be out of an interval from 0.7 mm to 2.5 mm. For example, the first and the second side lengths A, B may be equal to 1 mm. Alternatively, the first and the second side lengths A, B may be out of an interval from 0.7 mm to 22 cm. For example, the image sensor 10 may be fabricated as large as a wafer (the wafer may have a diameter of e.g. 300 mm). Alternatively, the first and the second side length A, B may have different values. The μm values in FIG. 1 and described above are only example values.

The circuits of the image sensor 10 with the exception of the array 11 are arranged at a frame or border area of the image sensor 10. Thus, the driver circuit 12, the multiplexer 13, the analog-to-digital converter 14, the voltage regulating circuit 15, the terminal area 16, the output driver circuit 20 and the clock generator 21 are arranged at the frame or the border area of the image sensor 10 (that means of the semiconductor body 22 of the image sensor 10).

The array 11 has a first and a second side length A1, B1. For example, the first and the second side length A1, B1 of the array 11 may be 0.8 mm or 0.6 mm. The frame around the array 11 on which the further circuits of the image sensor 10 are located, with the exception of the array 11, may have a width F. A maximum width F may be less than 300 μm, less than 200 μm or less than 100 μm. The width F of the frame may be equal at each of the four sides of the image sensor 10. In the example shown in FIG. 1, the width F obtains 100 μm. Alternatively, the width F is different at the four sides of the image sensor 10.

Advantageously, the image sensor 10 is realized in a very compact way. The image sensor 10 has a quadratic or approximately quadratic area. Thus, the smallest value of a circumference of the image sensor 10 can be achieved for a set value of an area of the image sensor 10.

The on-chip regulator 15 with the charge pump 65, e.g. to generate a negative voltage for a control signal or transfer signal TX of a transfer transistor or a positive signal above power supply, can be implemented on-chip in a very compact circuit, without the need for large on-chip or off-chip decoupling capacitors.

The small area makes it possible to include the image sensor 10 on the side e.g. in a CIS for a micro-camera module, where the available area is very limited. In a camera module for a camera-on-a-tip endoscope, the available area may be less than e.g. 100 μm wide at each side of the pixel array 11.

In FIG. 1, the floorplan of a CIS 10 for a miniature camera module is shown. The image sensor 10 includes circuits for readout and control. The peripheral area is only 100 micron wide at each side of the pixel array 11. In this area, also the voltage regulators and charge pumps can be included.

Figure 2:
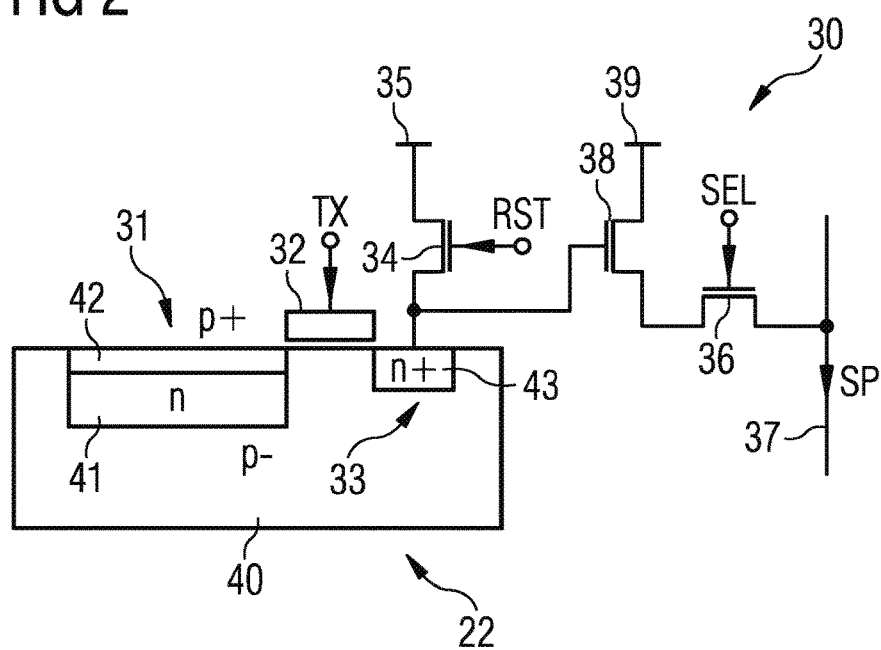
FIG. 2 shows an example of a pixel of an image sensor.

FIG. 2 shows an example of a pixel 30 of the array 11 of the image sensor 10 as described in FIG. 1. The array 11 comprises at least a first number N of pixels 30 as shown in FIG. 2. The pixel 30 is implemented as a four-transistor pixel (shorted 4T pixel) or a four-transistor active pixel. The pixel 30 comprises a photodiode 31, a transfer transistor 32 and a sense node 33. The photodiode 31 is coupled via the transfer transistor 32 to the sense node 33. A controlled path of the transfer transistor 32 couples the photodiode 31 to the sense node 33. The transfer transistor 32 may be named transfer gate. The pixel 30 comprises a reset transistor 34. A supply input 35 of the array 11 is coupled via the reset transistor 34 to the sense node 33. A controlled path of the reset transistor 34 couples the supply input 35 to the sense node 33.

Moreover, the pixel 30 comprises a selection transistor 36 arranged between the sense node 33 and a column line 37 of the array 11. The column line 37 may be coupled via the multiplexer 13 to the analog-to-digital converter 14. A source follower transistor 38 of the pixel 30 is coupled between the sense node 33 and the selection transistor 36. The sense node 33 is connected to a control terminal of the source follower transistor 38. A controlled path of the source follower transistor 38 couples a further supply input 39 to the selection transistor 36. Thus, the further supply input 39 is connected via the controlled path of the source follower transistor 38 and the controlled path of the selection transistor 36 to the column line 37. The further supply input 39 may be connected to the supply input 35. The supply input 35 and the further supply input 39 may be coupled or connected to the supply terminal 99. A voltage at the supply input 35 may be constant and may be equal to the supply voltage VDD.

The photodiode 31 is implemented as a pinned photodiode. The semiconductor body 22 of the image sensor 10 comprises a substrate 40. For example, the substrate may be p doped, optionally p-minus doped. The photodiode 31 comprises an n-doped region 41 and a p+ doped region 42 arranged between the n− doped region 41 and a semiconductor surface. The transfer transistor 32 is implemented as an n-channel metal-oxide-semiconductor field-effect transistor, abbreviated as n MOSFET. Also the reset transistor 34 may be realized as an n MOSFET. Alternatively, the reset transistor 34 may be realized as a p-channel metal-oxide-semiconductor field-effect transistor. The sense node 33 may be realized as a floating diffusion sense node. The sense node 33 may be realized as an n+ doped region 43 inside the substrate 40.

The transfer transistor 32 is controlled by a transfer signal TX. The reset transistor 34 is controlled by a reset signal RST. The transfer signal TX and the reset signal RST are control signals. The selection transistor 36 is controlled by a select signal SEL. During operation, the transfer signal TX sets the transfer transistor 32 in a conducting state and charge accumulated by the photodiode 31 is transferred via the transfer transistor 32 to the sense node 33. A voltage at the sense node 33 controls the source follower transistor 38. In the case that the selection transistor 36 is set in a conducting state by the select signal SEL, the source follower transistor 38 provides a pixel signal SP to the column line 37. Thus, the voltage at the floating diffusion sense node 33 is amplified via the source follower transistor 38 and provided via the selection transistor 36 to the column line 37. For a reset of the pixel 30, the reset signal RST sets the reset transistor 34 in a conducting state.

Advantageously, the four-transistor active pixel 30 is a good compromise between sensitivity and sufficient control of the signals of the pixel on the one hand, and on the size of the pixel 30 on the other hand.

In an alternative embodiment, not shown, the pixel 30 is implemented as a three-transistor pixel or a three-transistor active pixel. Thus, the transfer transistor 32 may be omitted. The reset transistor 34 couples the supply input 35 to the photodiode 31 and the control terminal of the source follower transistor 38 is connected to the photodiode 31.

In an alternative embodiment, not shown, the array 10 is implemented with a readout circuit shared amongst several pixels 30. Each pixel 30 contains the pinned photodiode 31 and the transfer transistor 32 or transfer gate, but the sense node 33, the reset transistor 34, the source follower transistor 38 and the selection transistor 36 are shared amongst two or more adjacent pixels 30. The selection transistor 36 may be named select transistor. The sense node 33 can be named floating diffusion.

In another embodiment, not shown, the pixel select transistor 36 can be omitted and the pixel 30 is de-selected by enforcing the sense node 33 to a low voltage, through a separate control line that connects to the drain of the reset transistor 34. These described pixel embodiments may be used in CMOS image sensors.

Alternatively, the voltage at the supply input 35 may be pulsed. This may be the case in a pixel without the reset transistor 34.

In another embodiment, not shown, the image sensor 10 may comprise at least one preamplifier. The column line 37 is coupled via the multiplexer 13 and the preamplifier to the analog-to-digital converter 14. The preamplifier may be arranged between the multiplexer 13 and the analog-to-digital converter 14. Alternatively, the preamplifier may be arranged between the column line 37 and the multiplexer 13 (thus, there may be e.g. a preamplifier for each column line).

FIG. 3A shows an example of the array 11 of the image sensor 10 which is a further development of the above-shown embodiments. The array 11 comprises rows and columns of pixels. The pixels may be realized such as the pixel 30 shown in FIG. 2. Thus, the array 11 comprises a first number N of rows 51, 52. In the example shown in FIG. 3A, the first number N is 2. The array 11 comprises a first and a second row 51, 52. Alternatively, the first number N may be 3, 4, 10, 100, 1000 or more 1000. The pixel 30 that may be named first pixel is part of the first row 51. The array 11 comprises a second pixel 53 which is part of the second row 52. Furthermore, the array 11 comprises a second number M of columns 71 to 73. In the example shown in FIG. 3A, the second number M is 3. Alternatively, the second number M may be 2, 4, 10, 100, 1000 or more than 1000. Thus, the array 11 comprises a third and a fifth pixel 54, 55 which are part of the first row 51. The array 11 comprises a fifth and a sixth pixel 56, 57 which are part of the second row 52. In the case the image sensor 10 is realized e.g. as a VGA image sensor, the first number N is 640 and the second number M is 480. VGA is the abbreviation for video graphics array. Thus, FIG. 3A may only show a small fraction of the array 11.

The image sensor 10 comprises the first number N of connection lines 58, 59. The first number N of connection lines 58, 59 run parallel to the first number N of rows 51, 52. Thus, a first connection line 58 connects the driver circuit 12 to each of the pixels 30, 54, 55 of the first row 51. The first connection line 58 connects the driver circuit 12 to the first row 51 of the pixels 30, 54, 55.

Correspondingly, a second connection line 59 connects the driver circuit 12 to each of the pixels 53, 56, 57 of the second row 52. The second connection line 59 connects the driver circuit 12 to the second row 52 of the pixels 53, 56, 57. In an example, each of the first number N of connections lines 58, 59 connects the driver circuit 12 to a corresponding row 51, 52 of pixels. In an example, one of the first number N of connections lines 58, 59 connects the driver circuit 12 to a corresponding one of the first number N of rows 51, 52 of pixels.

Alternatively, the first number N of connection lines 58, 59 may connect the driver circuit 12 only to a subset of the pixels of the corresponding rows. Thus, the first connection line 58 may connect the driver circuit 12 to a subset of the pixels of the first row 51.

Each of the pixels 30, 54 to 57 of the array 11 may be realized as the pixel 30 shown in FIG. 2. The first number N of connection lines 58, 59 are connected to control terminals of the transfer transistors 32 of the pixels of the array 11. Thus, the first connection line 58 connects the driver circuit 12 to the control terminals of the pixels 30, 58, 55 of the first row 51. Correspondingly, the second connection line 59 connects the driver circuit 12 to the control terminals of the transfer transistor 32 of the pixels 53, 56, 57 of the second row 52.

The transfer transistor 32 obtains a gate capacitance. Additionally, a metallization line for the realization of the connection line 58 has a width and a length inside the area of a pixel such as the pixel 30 and thus obtains a parasitic capacitance. The parasitic capacitance of the metallization line and the gate capacitance of the transfer transistor 32 result in a capacitance Ctx,pixel of the connection line 58 inside the area of one pixel 30. Thus, a pixel can be modelled with respect to the capacitance of the connection line as a capacitor with the capacitance Ctx,pixel. A value of the capacitance Ctx,pixel may be for example 10 Femtofarad per pixel (shorted 10 fF/pixel). Each of the first number N of connection lines 58, 59 may have the same capacitance value. A capacitance value Ctx,row of one of the connection lines of the first number N of connection lines can be calculated according to the following equation:

$$Ctx,row = M \cdot Ctx,pixel,$$

wherein M is the second number of columns 71 to 73 and Ctx,pixel is the capacitance value of a connection line 58, 59 inside of one pixel 30.

Since the connection lines 58, 59 are connected to control terminals, the connection lines 58, 59 could also be named control lines.

In an alternative, not shown, embodiment, the connection lines 58, 59 are not connected to a control terminal of a transistor but to the supply input 35 or the further supply input 39. Thus, the connection lines could be named supply lines.

The image sensor 10 uses the capacitance Ctx,row of the respective control lines 58, 59 in the pixel array 11 as the buffer capacitor for the voltage regulator 15. In the following, a connection line 58 connected to transfer transistors 32 will be used by means of example, but the driver circuit 12 may be connected to other control lines on the pixel array 11 too, such as the reset line. A connection line 58 connected to transfer transistors 32 may be named transfer gate control line.

As shown in FIG. 3A, the transfer gate control line 58 can be modelled in the pixel array 11. In each pixel 30, 53 to 57, this control line 58 has an equivalent capacitance Ctx,pixel, mainly composed by the gate capacitance of the transfer line and the parasitic coupling capacitances of the routing of the transfer line, such as metal-to-substrate, metal-to-metal capacitances and metal fringe capacitances. The capacitance per pixel is called Ctx,pixel and is typically around 5 to 10 fF/pixel.

For an array of pixels, the capacitance per row Ctx,row is:

$$Ctx,row = number\text{-}of\text{-}columns \cdot Ctx,pixel.$$

For a VGA chip (640×480) with 5 fF/pixel, the capacitance per row Ctx,row is about 3.2 pF. The total capacitance of the array 11 is:

$$Ctx,array = number\text{-}of\text{-}rows \cdot Ctx,row.$$

For a VGA chip, Ctx,array is about 1.5 nF. Advantageously, the total array of control lines offer a significant capacitance.

The first connection line 58 (which may be named transfer line) is typically kept at a negative voltage during exposure; this is to reduce the dark current of the pixel array 11. For example, the voltage of the transfer signal TX is between −0.2V and −2V or between −0.6V and −1.2V, e.g. −0.8V. The substrate 40 (p-type) is connected to ground GND and then the surface under the transfer gate 32 is accumulated. This reduces dark current. The capacitance of the gate is the capacitance of the gate in accumulation, and formed by the hole accumulation layer, the gate oxide dielectric and the gate polysilicon.

The voltage regulating circuit 15 provides an output voltage VOUT that is realized as regulated negative voltage. To reset or readout a row 51 of pixels 30, the connection line 58 of this row 51 needs to be pulsed to a high voltage, e.g. 3.3V or 2.8V, while the connection line 50 of all other rows 52 stay at the output voltage VOUT. The reset can be done by a switch in the row driver circuit 12, e.g. a p-channel MOSFET connected to the high voltage (e.g. shown in FIG. 4A).

Then, when the connection line 58 is designed to be pulled low again, this can simply be done by connecting the connection line 58 again to the same node that connects all other connection lines 59, which are stuck at the output voltage VOUT (that is a negative voltage). This can be done by switching an n-channel MOSFET which connects the control line of the line that is readout back to the other lines. That n-channel MOSFET needs to be driven with negative gate voltage too at the moment that the row needs to be pulled up. That negative voltage is either taken from the pixel control lines, or, alternatively, from a separate charge pump using a similar principle as for the array. This operation is described in more detail below.

The negative voltage on the pixel array is built up by a small charge pump 65. That charge pump 65 is clocked several times during each row period. In one case, it is clocked at the same frequency as the pixel clock, this is the frequency that controls the multiplexed readout of all pixels on the row. Then in fact, if the efficiency of the charge pump 65 would be 100%, the charge pump 65 can be made by a capacitance Ctx,pixel. For a VGA sensor, the frequency will be 640 times the line frequency. Assuming the sensor operates at 30 fps, the frame frequency is 30 Hz, the line frequency is approximately 30 Hz*480 or 15 kHz, and the pixel frequency is approximately 15 kHz 640 or 10 MHz. Obviously, the efficiency of the charge pump is not 100%. But with an efficiency of 25%, a capacitance of 4*Ctx,pixel, or about 40 fF in our example, would suffice.

Figure 3B:
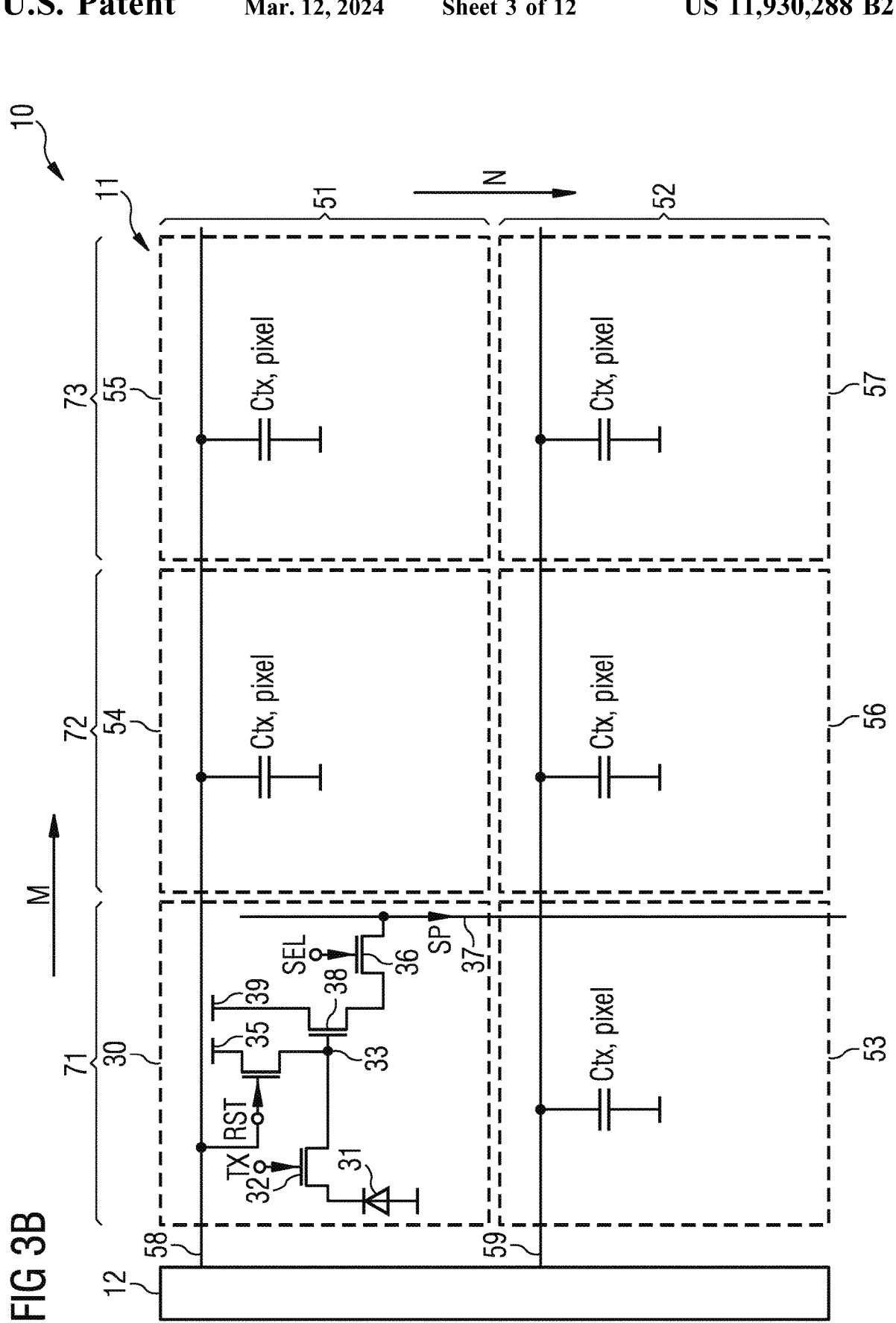

FIG. 3B shows a further example of details of the image sensor 10 that is a further development of the above-shown embodiments. The first number N of connection lines 58, 59 connect the driver circuit 12 to control terminals of the reset transistors 34 of the pixels 30, 53 to 57 of the array 11. Thus, the first connection line 58 connects the driver circuit 12 to the control terminal of the reset transistor 34 of the first pixel 30 and also to the control terminals of the reset transistors 34 of the further pixels 54, 55 of the first row 51. Thus, the first connection line 58 connects the driver circuit 12 to control terminals of the reset transistors 34 of the second number M of pixels 53, 56, 57 of the first row 51. Correspondingly, the second connection line 59 connects the driver circuit 12 to control terminals of the reset transistors 34 of the second number M of pixels 53, 56, 57 of the second row 52. The reset signal RST may be applied to the connections lines 58, 59 and generated by the driver circuit 12.

In modern CIS pixels the control lines 58, 59 for the pixel array 11 may need dedicated voltages deviating from the standard supply voltage VDD and VSS levels of the analog and digital circuits. The reference potential GND may be named ground or VSS level. The reference potential GND is tapped at the reference potential terminal 98. For example, as shown in FIG. 3A, on a 4-transistor active pixel as shown in FIG. 2, it is advantageous to use a negative voltage on the transfer gate 32 during the exposure to reduce the dark current. This negative voltage keeps the transfer gate 32 in accumulation during exposure and reduces hereby the dark current of the pixel.

Another example is a positive voltage used on the gate of the reset transistors 34, which exceeds the supply voltage VDD of the chip, as shown in FIG. 3B. The reset signal RST is provided to a control terminal of the reset transistor 34. The output signal VOUT may be higher than the supply voltage VDD. The reset signal RST may receive a voltage higher than the supply voltage VDD. The reset signal RST is generated by the driver circuit 12 and the voltage regulating circuit 15. The reset signal RST is pulsed. This is done to increase the signal swing on the floating diffusion sense node 33.

These specific voltages need to be supplied to the pixel by the driver circuit 12 that comprises row control drivers. The image sensor 10 simplifies the generation of these voltages, and makes it possible to generate them on very small chip area. Thus, the voltages are generated on-chip and do not have to be provided to the chip via supply pins.

The same method can be used for other control lines, where they have to be held during most of the time or for most of the lines at a generated voltage, and where one row of the pixel array 11 is to be pulsed to a different voltage during readout or reset of the row 51, 52. This voltage needed during readout/reset must be easy to generate or already available in the circuit. The capacitance of the non-pulsed rows is used as a buffer capacitor for the regulator 15.

As shown in FIG. 3B, a row is reset to a voltage higher than the supply voltage VDD of the image sensor 10. A small charge pump 65 will then pump up the reset lines 58, 59 to this voltage. A 4T pixel array can be controlled with a timing scheme where all floating diffusions 33 are kept in reset all the time, except for the row 51 that is read out. For that row 51, the reset line 58 is pulsed to the reference potential GND.

The image sensor 10 can be configured to realize a shared pixel readout, where more than one pixel is read out via the same source follower (e.g. 2×2 shared pixels, 2×1 vertically shared or other shared configurations). In such pixel there may be one reset line per two pixel rows. There may be two transfer lines per pixel row (e.g. in 2×2 shared pixels).

Figure 4A:
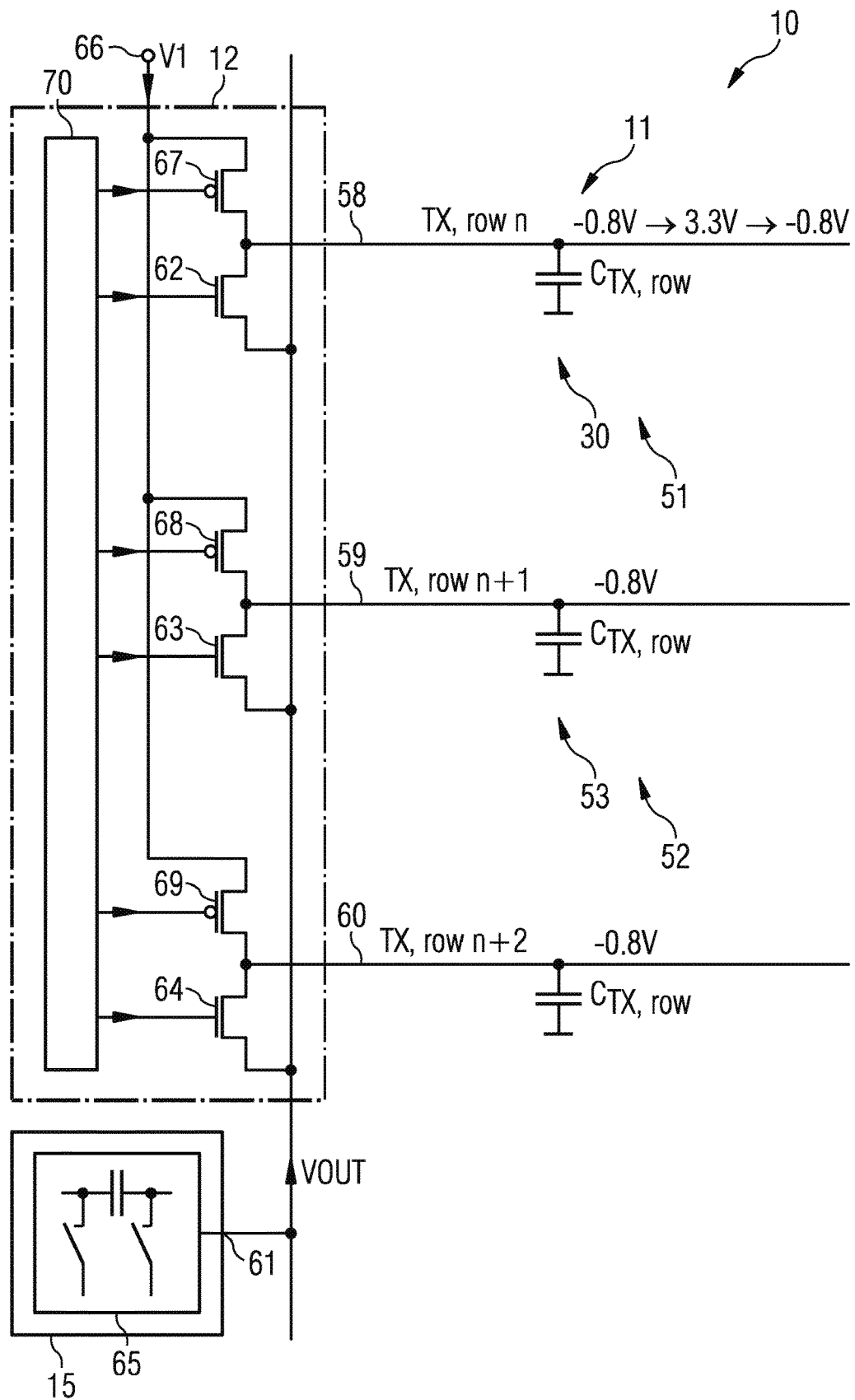
FIGS. 4A to 4D show examples of details of an image sensor.

FIG. 4A shows an example of further details of the image sensor 10 that is a further development of the above-shown embodiments. The voltage regulating circuit 15 comprises the charge pump 65. The charge pump 65 comprises an output that is connected to an output 61 of the voltage regulating circuit 15. The driver circuit 12 can be realized as row driver circuit. The driver circuit 12 comprises the first number N of the switches 62 to 64 which are coupled to the first number N of connection lines 58 to 60 and to the output 61 of the voltage regulating circuit 15. Thus, each of the first number N of switches 62 to 64 has a first terminal directly and permanently connected to the output 61 of the voltage regulating circuit 15. Moreover, the first number N of switches 62 to 64 have second terminals which are directly and permanently connected to the first number N of connection lines 58 to 60. The first number N of connection lines 58 to 60 are connected via the first number N of switches 62 to 64 to the output 61 of the voltage regulating circuit 15.

Additionally, the driver circuit 12 comprises a first terminal 66. The driver circuit 12 comprises a first number N of further switches 67 to 69 which are coupled to the first number N of connection lines 58, 59, 60 and to the first terminal 66. Thus, first terminals of the first number N of further switches 67 to 69 are directly and permanently connected to the first terminal 66. Moreover, second terminals of the first number N of further switches 67 to 69 are directly and permanently connected to the first number N of connection lines 58 to 60. The first number N of connection lines 58 to 60 are connected via the first number N of further switches 67 to 69 to the first terminal 66. The first number N of switches 62 to 64 and of further switches 67 to 69 may be realized as field-effect transistors, shorted FET. The first number N of switches may be complementary to the first number N of further switches. Thus, for example the first number N of switches 62 to 64 may be realized as re-channel FET and the first number N of further switches 67 to 69 may be realized as p-channel FET. The first terminal 66 of the driver circuit 12 may e.g. be coupled or connected to the supply terminal 99. A supply voltage VDD may be tapped at the supply terminal 99.

Thus, a first switch 62 of the first number N of switches 62 to 64 connects the first connection line 58 to the output 61 of the voltage regulating circuit 15. A first further switch 67 of the first number N of further switches 67 to 69 couples the first connection line 58 to the first terminal 66. The driver circuit 12 connects the charge pump 65 to the rows 58 to 60. The driver circuit 12 may have a so-called multiplexing function.

In an embodiment, not shown, the control terminal of the first switch 62 is connected to a control terminal of the first further switch 67.

A control circuit 70 is connected to the control terminals of the first number N of switches 62 to 64 and to the control terminals of the first number N of further switches 67 to 69. The first connection line 58 obtains a row capacitance Ctx,row as described above. The first number N of connection lines 58 to 60 may be connected to the transfer transistors of the pixels of the array 11, as shown in FIG. 3A. The driver circuit 12 generates transfer signals TX and provides the transfer signals TX to the first number of connection lines 58 to 60, such as the transfer signal TX,row n to the first connection line 58, the transfer signal TX, row n+1 to the second connection line 59 and the transfer signal TX,row n+2 to the third connection line 60.

Alternatively, the first number N of connection lines 58, 59, 60 may be connected to control terminals of the reset transistors 34 of the pixels of the array 11, as shown in FIG. 3B.

In an example, in a period of time, the second and the third connection line 59, 60 are constantly charged to a voltage value of −0.8 V. The first connection line 58 will receive the voltage values of −0.8 V, then of 3.3 V and then again of −0.8 V. This operation is described below using FIGS. 4B to 4D which show a first, a second and a third operation phase P1, P2, P3.

Figure 4B:
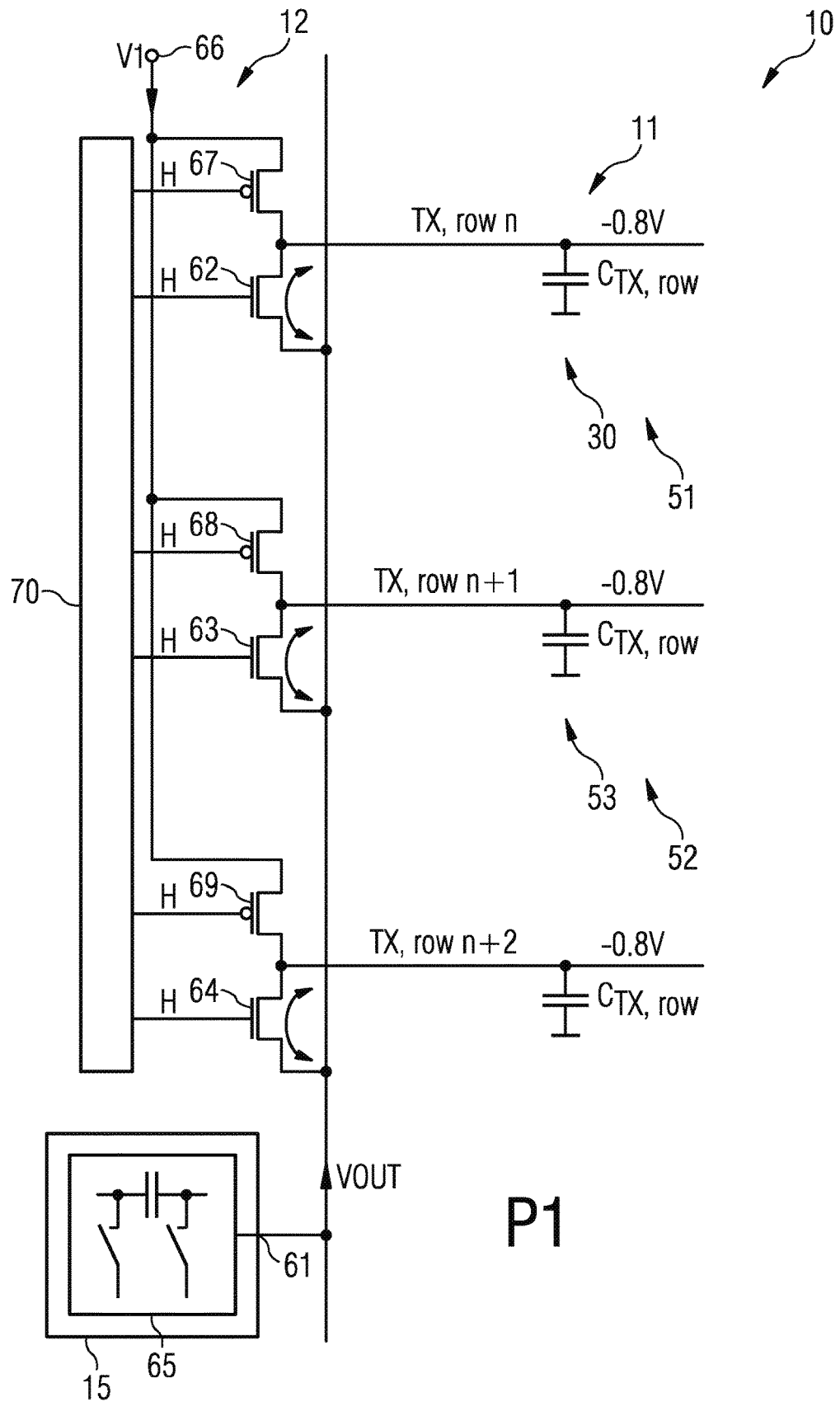

As shown in FIG. 4B, in a first operation phase P1, the first number N of switches 62 to 64 are set in a conducting state by the control circuit 70 and the first number N of further switches 67 to 69 are set in a non-conducting state. Arrows with two arrowheads indicate the switches and further switches which are in a conducting state. Thus, the control circuit 70 may provide control signals to the control terminals of the first number N of switches 62 to 64 and of further switches 67 to 69 with a first logical value which may be the value H. The first logical value may be equal to a positive voltage such as a positive supply voltage VDD. The charge pump 65 generates an output voltage VOUT at the output 61 of the voltage regulating circuit 15. The output voltage VOUT may be named charge pump voltage. The output voltage VOUT is provided via the first number N of switches 62 to 64 to the first number N of connection lines 58 to 60.

Figure 4C:
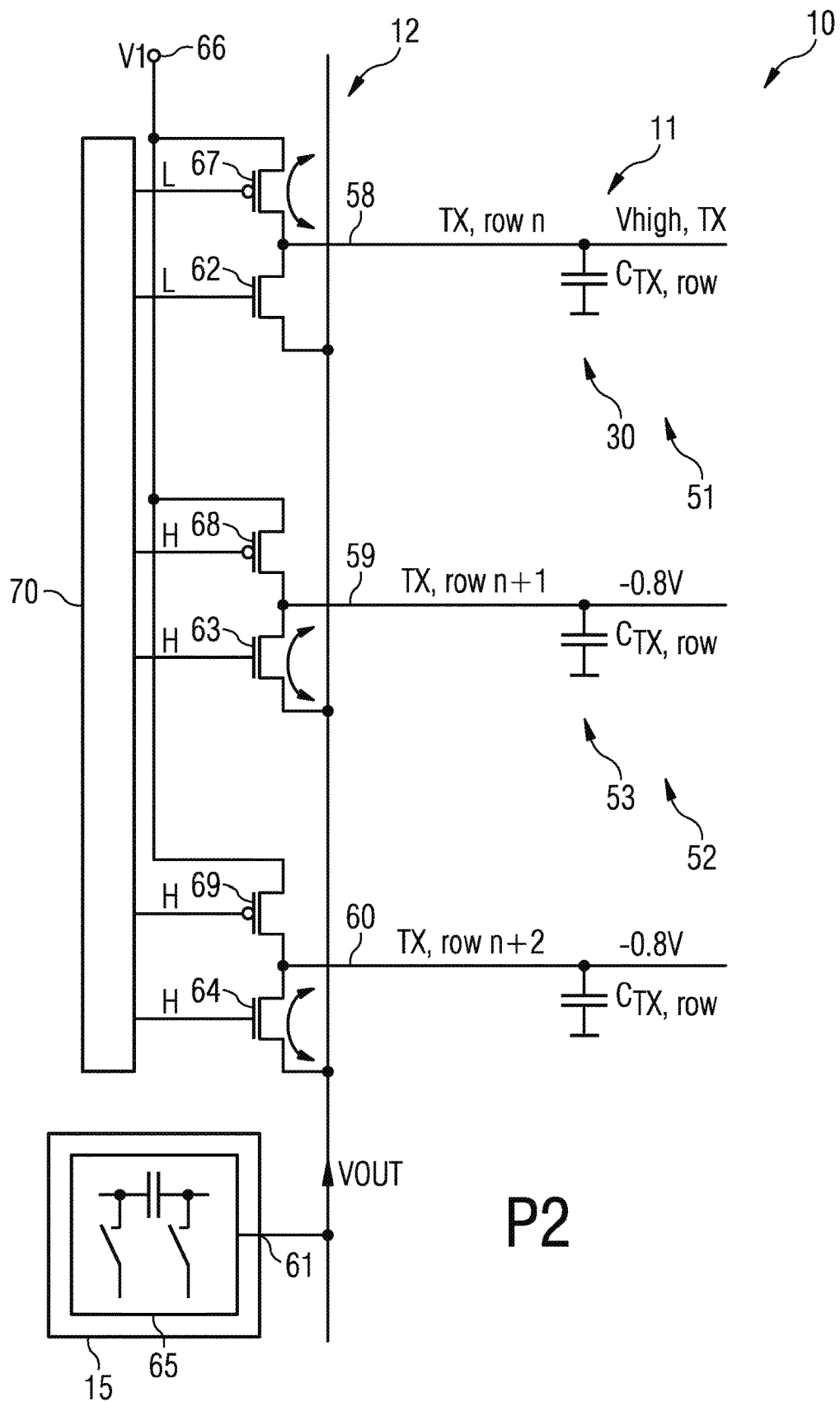

As shown in FIG. 4C, in a second operation phase P2, one switch of the first number N of switches 62 to 64 is set in a non-conducting state, for example the first switch 62. The other of the first number N of switches 63, 64 are set in a conducting state. Moreover, the corresponding switch of the first number N of further switches 67 to 69 is set in a conducting state. In this example the first switch 62 is set in a non-conducting state and the first further switch 67 is set in a conducting state. The other switches of the first number N of further switches 68, 69 are set in a non-conducting state. Thus, the output of the charge pump 65 is conductively connected via the output 61 of the voltage regulating circuit to the majority of the connection lines of the first number N of connection lines 58 to 60. Only one connection line 58 is conductively connected to the first terminal 66. Thus, the first connection line 58 is charged to a first terminal voltage V1 that can be tapped at the first terminal 66. The first terminal voltage V1 may be e.g. equal to the supply voltage VDD or to another voltage. The first terminal voltage V1 may be equal to a voltage Vhigh,tx. Thus, the first connection line 58 obtains the voltage Vhigh,tx. The charge pump 65 is continuously operating.

Figure 4D:
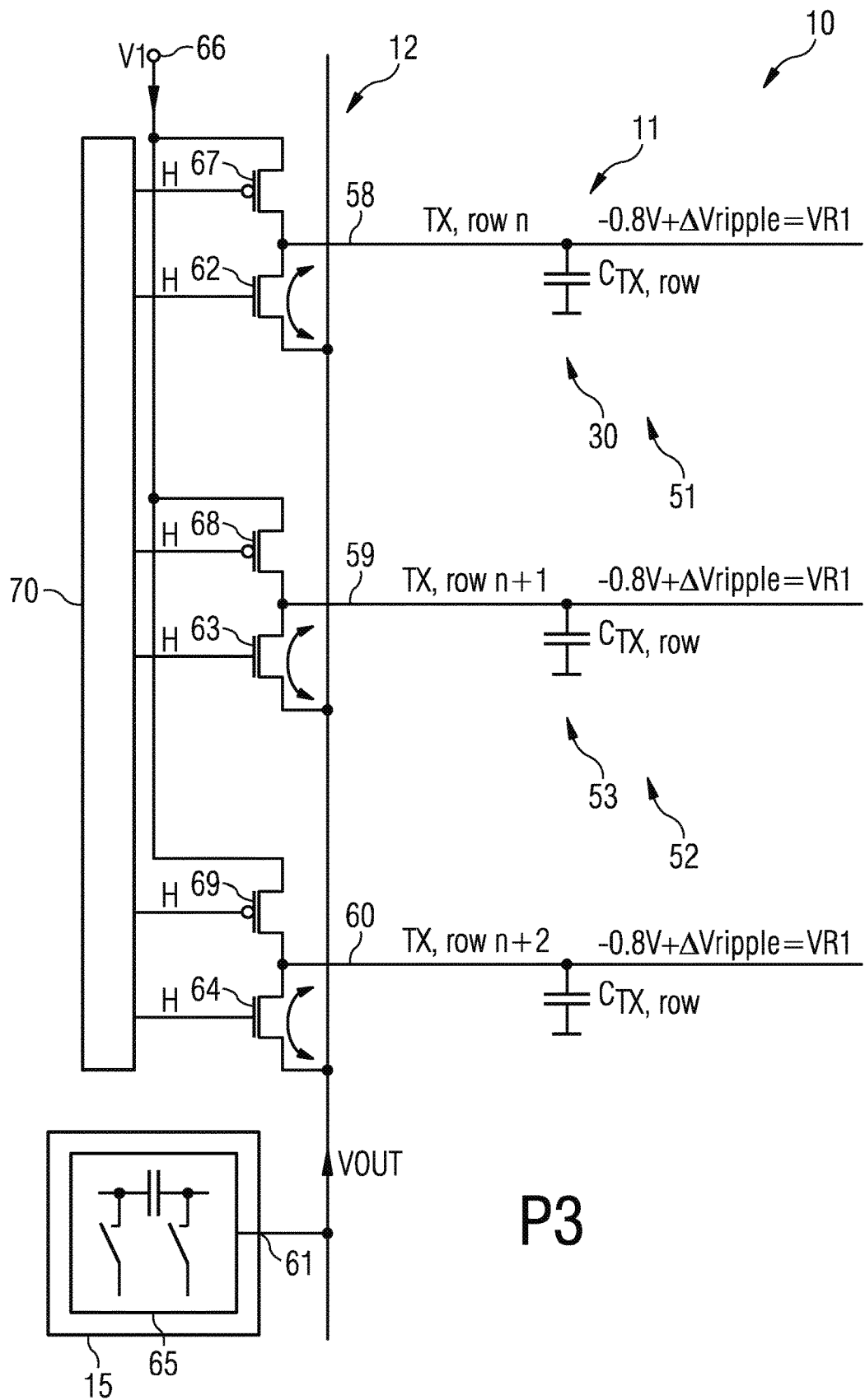

As shown in FIG. 4D, in the third operation phase P3, the first switch 62 is set in a conducting state and the further first switch 67 is set in a non-conducting state. In the third operation phase P3, the state of the switches and of the further switches is the same as the state in the first operation phase P1. By closing the first switch 62, charge flows between the different connection lines of the first number N of connection lines 58 to 60. Thus, the first number N of connection lines 58, 59, 60 obtain an equal voltage value VR1 which could be calculated according to the following equation:

VR1=VOUT+ΔVripple, wherein ΔVripple is a voltage deviation that occurs during the transient between the second and the third operation phase P2, P3. After a short period of time the voltage values of each of the connection lines 58 to 60 again obtain the value of the output voltage VOUT. The charge pump 65 uses the capacitance values of the majority of the connection lines of the first number N of connection lines 58 to 60 for stabilization of the output voltage VOUT.

In FIGS. 4A to 4D, a schematic of the drivers for the control lines 58 to 60 is elucidated. Each control line 58 to 60 is connected by a switch of the number N of switches 62 to 64 to a common negative voltage node that is the output 61 of the voltage regulating circuit 15. The number N of switches 62 to 64 are realized as n-channel MOSFETs, shorted NMOS transistors. The number N of further switches 67 to 69 are realized as p-channel MOSFETs, shorted PMOS transistors. In normal situation, all NMOS transistors are conductive (that means in a conducting state) and all PMOS transistors are open (that means in a non-conducting state). Then a large node is formed which is kept at the output voltage VOUT which is a negative voltage. At start-up, this output voltage VOUT is pumped negative by the charge pump 65. It will take about one frame readout time to create the required negative voltage. This is appropriate in most applications. E.g. the first frame in a rolling shutter sensor is anyhow needed to start the exposure.

When the connection line 58 needs a transfer pulse, the connection line 58 is conductively connected by the PMOS transistor of the further switch 67 to the first voltage V1 (e.g. 3.3V) and the NMOS transistor of the switch 62 is opened (that means set in a non-conducting state). The connection line 58 will then quickly rise to the first voltage V1. After charge transfer, when the connection line 58 needs to go down again, the connection line 58 is re-connected to the common node (that is the output 61) by the NMOS switch 62. FIGS. 4B to 4D show the sequence of pulsing for the row n or the first row 51 in the array 11.

After re-connecting row 51 to the rest of the connection lines 59, 60 that are hold on the negative voltage, a ripple ΔVripple will occur. This ripple is equal to the voltage swing on the connection line, ΔVTX, divided by the number of rows in the array minus 1, thus divided by N−1. In an example, assuming a VGA sensor, and assuming that the swing ΔVTX on the connection line is 4.1V (−0.8V→3.3V→−0.8V), the ripple ΔVripple will be 4.1V*1/480=8.5 mV. This 8.5 mV ripple will be discharged by the small charge pump 65 during the row frequency time.

The charge pump 65 can be clocked at the pixel clock frequency. A line frequency of 15 kHz and pixel clock frequency of 10 MHz may be used for a VGA sensor at 30 fps. A current Icp to be provided by the charge pump is equal to:

Icp=fpix·Ctx,array·ΔVripple=fpix·Ctx,row·ΔVTX, wherein fpix is a pixel clock frequency or pixel frequency, Ctx,array is a capacitance of the number N of connection lines 58 to 60, ΔVripple is the voltage ripple, Ctx,row is a capacitance value of one of the connection lines and ΔVTX is the swing on one TX connection line 58. For a VGA example, this is 10 MHz·8.5 mV·1.5 nF=127 µA. Such small current can be provided by a small charge pump 65. The charge pump 65 can be switching from a 3.3 V supply at 10 MHz with a capacitance:

Ccp=Icp/(nrow·fcp·ΔVcp)

which is 6 fF for a VGA example. This assumes, as written before, a 100% efficiency. But also at 25% efficiency, the capacitor in the charge pump 65 remains small.

In an alternative embodiment, not shown, regarding the control of the reset transistor 34 as shown in FIG. 3B, the first terminal voltage V1 may be e.g. equal to the reference potential GND or to another voltage. The output voltage VOUT may be e.g. higher than the supply voltage VDD.

Figure 5A:
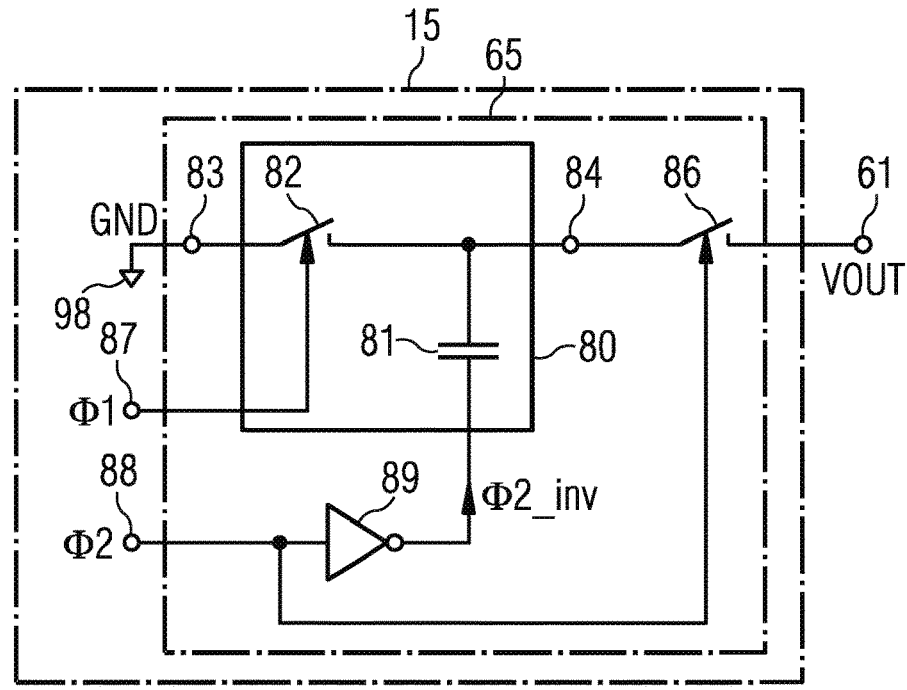
FIGS. 5A to 5C show examples of a charge pump.

FIG. 5A shows an example of the voltage regulating circuit 15 which is a further development of the above shown embodiments. The charge pump 65 comprises a third number L of stages, wherein the third number L may be 1, 2, 3, 4 or more than 4. In the example shown in FIG. 5A, the third number L of stages is 1. Each of the third number L of stages comprises one capacitor.

The charge pump 65 comprises a first stage 80. The first stage 80 comprises a first capacitor 81. The first stage 80 comprises a first pump switch 82 that couples a first stage input 83 of the first stage 80 to a first electrode of the first capacitor 81. The charge pump 65 comprises an output switch 86 that couples a first output 84 of the first stage 80 to the output 61 of the voltage regulating circuit 15. The voltage regulating circuit 15 comprises a first and a second clock terminal 87, 88. The first clock terminal 87 is connected to a control input of the first pump switch 82. The second clock terminal 88 is connected to a control input of the output switch 86. An inverter 89 of the voltage regulating circuit 15 couples the second clock terminal 88 to a second electrode of the first capacitor 81.

A first clock signal Φ1 is provided to the first clock terminal 87. A second clock signal Φ2 is provided to the second clock terminal 88. The inverter 89 generates an inverted second clock signal Φ2_inv. The first and the second clock signal Φ1, Φ2 and the inverted second clock signal Φ2_inv are shown in FIG. 5B.

In the case that the charge pump 65 is configured to generate an output voltage VOUT with a value smaller than the reference potential GND, the reference potential GND is provided to the first stage input 83. The reference potential terminal 98 is connected to the first stage input 83. The reference potential terminal 98 is connected to the reference pad 18. The operation will be discussed below.

The clock generator 21 is coupled to the charge pump 65 and to the multiplexer 13 by a not shown connection line. The first and/or the second clock signal Φ1, Φ2 is also provided to the multiplexer 13 for operating the multiplexer 13.

Figure 5B:
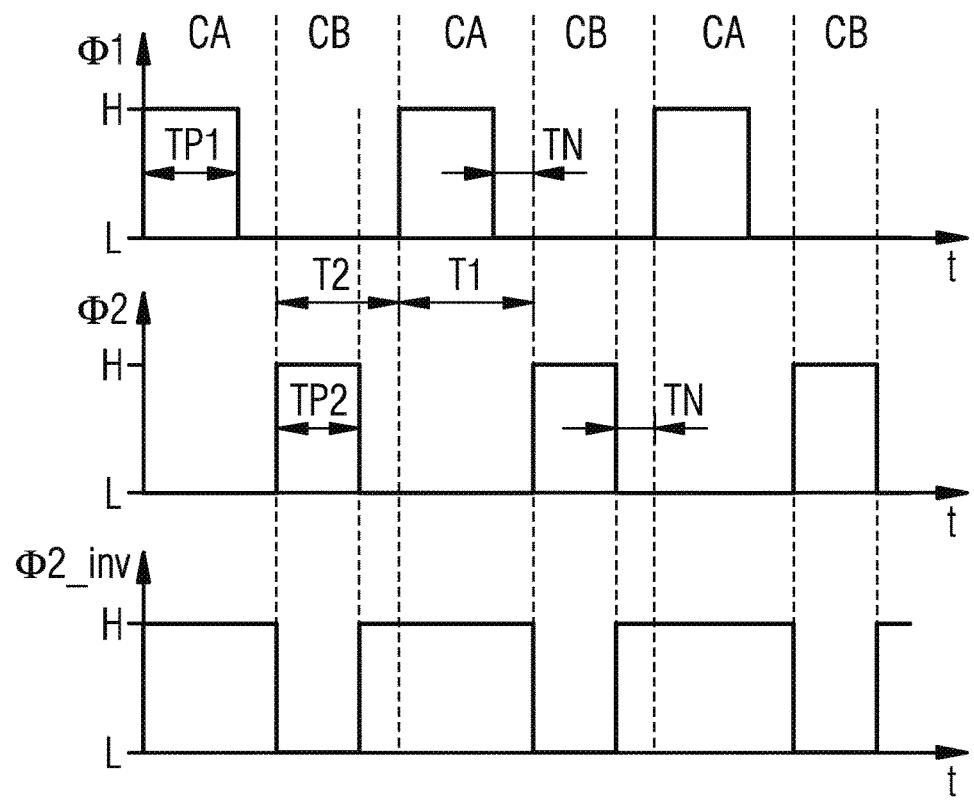

FIG. 5B shows an example of a first and a second clock signal Φ1, Φ2 and of the inverted second clock signal Φ2_inv that can be used in the voltage regulating circuit 15 as shown in FIG. 5A. The pulses of the first clock signal Φ1 and of the second clock signal Φ2 alternate. Thus, a pulse of the second clock signal Φ2 is between two pulses of the first clock signal Φ1 and a pulse of the first clock signal Φ1 is between two pulses of the second clock signal Φ2 (with the exception of a first pulse of the first or the second clock signal Φ1, Φ2). A pulse of the first clock signal Φ1 has a first duration TP1 and a pulse of the second clock signal Φ2 has a second duration TP2. The first duration TP1 and the second duration TP2 may be equal. A cycle of the second clock signal Φ2 has the same duration T as a cycle of the first clock signal Φ1. A duty cycle of the first clock signal Φ1 and of the second Φ2 may be less than 50%. Thus, there may be non-overlap times with the duration TN between the pulses of the first and of the second clock signals Φ1, Φ2. The inverted second clock signal Φ2_inv is inverted with respect to the second clock signal Φ2.

A pulse of the first and the second clock signal Φ1, Φ2 has the first logical value H that may have the value of a supply voltage VDD. The first and the second clock signal Φ1, Φ2 have the second logical value L that may be equal with the reference potential GND between two pulses. In a first clock phase CA, the first clock signal Φ1 has a pulse and the second clock signal Φ2 is free of a pulse. In a second clock phase CB, the second clock signal Φ2 has a pulse and the first clock signal Φ1 is free of a pulse. The first and the second clock phase CA, CB alternate. The first clock phase CA has a duration T1 and the second clock phase CB has a duration T2. The cycle of the first clock signal Φ1 has a duration of T=T1+T2.

In the first clock phase CA, the first pump switch 83 is set in a conducting state by the pulse of the first clock signal Φ1 and the output switch 86 is set in a non-conducting state by the second clock signal Φ2. Moreover, the inverted second clock signal Φ2_inv and thus the supply voltage VDD is provided to the second electrode of the first capacitor 81. At the end of the first clock phase CA, the second electrode of the first capacitor 81 is positive with respect to the first electrode of the first capacitor 81.

In the second clock phase CB, the first pump switch 82 is set in a non-conducting state by the first clock signal Φ1 and the output switch 86 is set in a conducting state by the pulse of the second clock signal Φ2. In the second clock phase CB, the inverted second clock signal Φ2_inv and thus the reference potential GND is provided to the second electrode of the first capacitor 81. By providing the reference potential GND to the second electrode of the first capacitor 81 at the start of the second clock phase CB, the voltage at the first electrode of the first capacitor 81 drops and thus the output voltage VOUT is reduced.

The non-overlap times Tn between the pulses of the first and the second clock signal Φ1, Φ2 have the effect that the first pump switch 82 and the output switch 86 are not simultaneously in the conducting state at any point of time. Thus, a current flow from the output 61 to the first stage input 83 is avoided.

The cycles of the first and the second clock signal Φ1, Φ2 are repeated. After several cycles and in the case of a small load at the output 61, the output voltage VOUT obtains the value of minus the supply voltage that is −VDD. Thus, the charge pump 65 is configured to generate the output voltage VOUT with a value that is negative with respect to the reference potential GND.

The voltage regulating circuit 15 may comprise a pump control circuit, not shown, for regulating the output voltage VOUT. A comparator of the pump control circuit may compare the output voltage VOUT with a reference voltage. The pump control circuit controls the charge pump 65, e.g. by skipping pulses of the first and the second clock signal Φ1, Φ2 in case the output voltage VOUT is below the reference voltage.

Figure 5C:
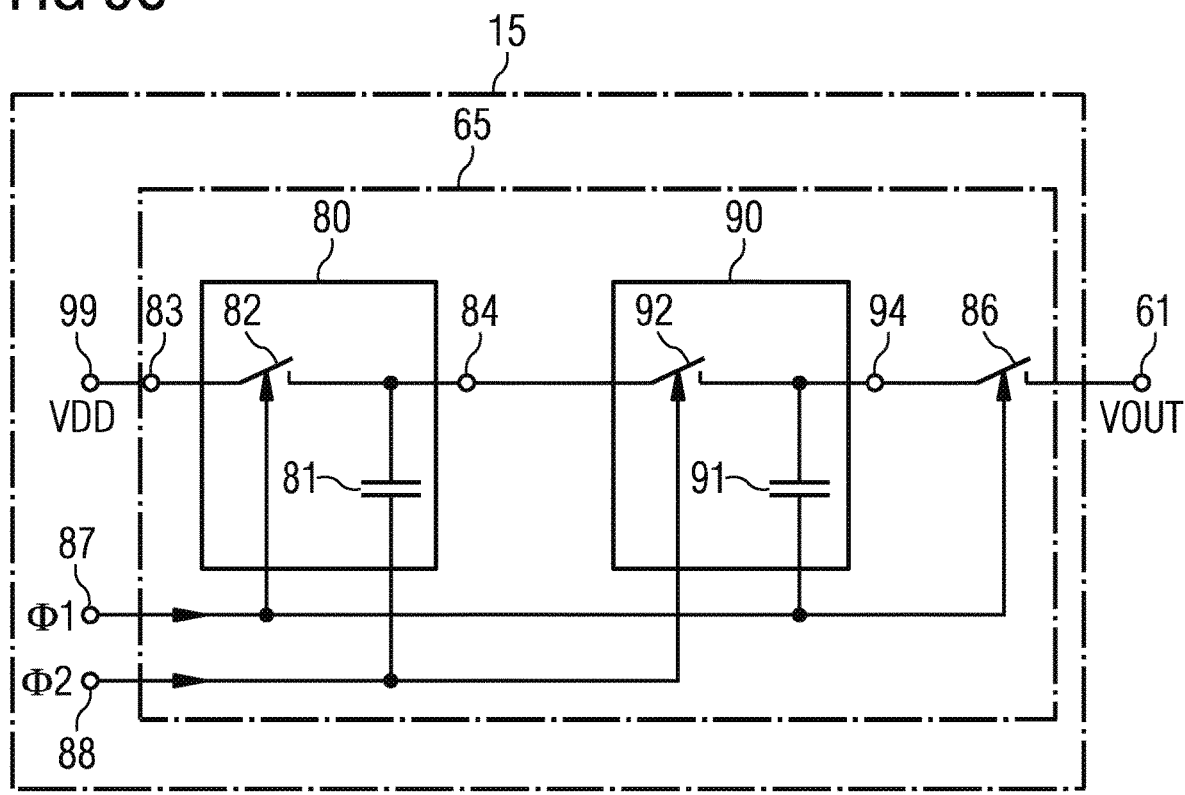

FIG. 5C shows a further example of the voltage regulating circuit 15 that is a further development of the embodiment shown in FIGS. 5A and 5B. The charge pump 65 comprises a second stage 90. The second stage 90 is realized corresponding to the first stage 80. Thus, the second stage 90 comprises the second capacitor 91 and a second pump switch 92. The second pump switch 92 couples the first output 84 of the first stage 80 to a first electrode of the second capacitor 91. The first electrode of the second capacitor 91 is coupled via a second output 94 of the second stage 90 and the output switch 86 to the output 61 of the voltage regulating circuit 15. The first clock terminal 87 is connected to the control input of the first pump switch 82, to the control input of the output switch 86 and to a second electrode of the second capacitor 91. The second clock terminal 88 is connected to a control input of the second pump switch 92 and to the second electrode of the first capacitor 81.

In the case that the charge pump 65 as shown in FIG. 5C is configured to generate the output voltage VOUT with a voltage value higher than the value of the supply voltage VDD, the supply voltage VDD is provided to the first stage input 83 of the first stage 80. Thus, the first stage input 83 of the first stage is connected to the supply terminal 99. The supply terminal 99 may be connected to the supply pad 17 of the terminal area 16. The operation is similar to the operation of the charge pump 65 having only the first stage 80 as described above. The first and the second clock signal Φ1, Φ2 have the form as shown in FIG. 5B and are described above.

The operation may start with the first clock phase CA. In the first clock phase CA, the first pump switch 82 is set in a conducting state by the first clock signal Φ1. Thus, the first stage input 83 of the first stage 80 is conductively connected via the first pump switch 82 to the first electrode of the first capacitor 81. The reference potential GND is provided to the second electrode of the first capacitor 81 by the second clock signal Φ2. The second pump switch 92 is set in a non-conducting state by the second clock signal Φ2. The output switch 86 is set in a conducting state by the first clock signal Φ1. The supply voltage VDD is provided to the second electrode of the second capacitor 91 by the first clock signal Φ1. Thus at the end of the first phase CA, the first capacitor 81 is charged with the supply voltage VDD, whereas the voltage at the first electrode is higher than the voltage at the second electrode of the first capacitor 81. Simultaneously, the second electrode of the second capacitor 91 is on the supply voltage VDD and the first electrode of the second capacitor 91 has the value of the output voltage VOUT.

In the next phase, namely the second clock phase CB, the first pump switch 82 is set in a non-conducting state by the first clock signal Φ1 and the second electrode of the first capacitor 81 is supplied by the supply voltage VDD by the second clock signal Φ2. The output switch 86 is set in a non-conducting state by the first clock signal Φ1 and the second electrode of the second capacitor 91 is set on the reference potential by the first clock signal Φ1. Since the second pump switch 92 of the second stage 90 is set in a conducting state by the second clock signal Φ2, charge flows from the first electrode of the first capacitor 81 to the first electrode of the second capacitor 91. The operation is repeated. A value of the output voltage VOUT is higher than a value of the supply voltage VDD. After several cycles and in case of a low load, the output voltage VOUT may have the value of three times VDD.

In some CIS 10, the specific voltages required for the array 11 may be supplied externally via extra supply pins. The drawback is that extra pins are needed and extra circuitry is needed on the camera PCB to generate these voltages. This adds to the camera cost and the space for that circuitry and these extra interconnects is not always available. E.g. on a camera-on-a-tip for an endoscope, there is no area to create this voltage regulators. Advantageously, the image sensor 10 shown in FIGS. 1 to 5C avoids these extra surplus pins.

In the image sensor 10, these voltages are generated on-chip to save circuitry on the camera board. The voltage regulation circuit 15 is made on chip. This circuit 15 generates a voltage such as an output voltage VOUT at the output 61. The coupling of the output 61 of the voltage regulating circuit 15 to the first number N of connection lines 58 to 60 avoids a coupling of said output 61 to a large capacitor, on-chip and/or off-chip. The charge pump 65 may be used in order to generate voltages above power supply level VDD and/or below ground level GND. The first number N of connection lines 58 to 60 contribute to provide a stable power supply on-chip.

The capacitors of the charge pump 65 such as the first and the second capacitor 81, 91 may be realized on-chip, for example in metal layers on top of the pixel array or, in a stacked CIS, the capacitors of the charge pump 65 such as the first and the second capacitor 81, 91 may be included in a bottom die of the stacked CIS (the die containing the readout circuit and interfacing circuit). The bottom die may be fabricated as a further semiconductor body.

The disclosure describes a way or ways to make on a small area a regulator 15 for the pixel array 11 that supplies the output voltage VOUT as a negative voltage or as a voltage above the supply voltages VDD. Thus, a large area and/or external or internal large capacitors are not required.

The voltage regulating circuit 15 may comprise more than one charge pump 65. For example, the voltage regulating circuit 15 may comprise the charge pump 65 for generating the output voltage VOUT that is used to control the transfer transistors 32 as shown in FIG. 3A (e.g. the charge pump 65 shown in FIG. 5A). Moreover, the voltage regulating circuit 15 may comprise a further charge pump 65 for generating the output voltage VOUT that is used to control the reset transistors 34 as shown in FIG. 3B (e.g. the charge pump 65 shown in FIG. 5B).

Figure 6A:
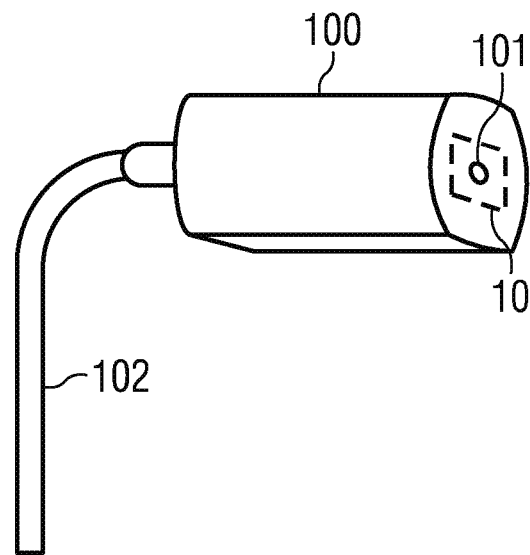
FIGS. 6A and 6B show examples of a camera.

FIG. 6A shows an example of a camera 100 which comprises the image sensor 10 according to one of the embodiments described above and shown in FIGS. 1 to 5C. The camera 100 comprises the image sensor 10 and a lens 101 attached to the image sensor 10. The small size of the image sensor 10 is advantageous for the camera 100 having small size. A field of application of the CIS 10 is a micro-camera module such as implemented in a cheap internet-of-things device (shorted IOT device). Thus, the camera 100 realizes a miniature camera module, with its lens 101, and a readout wire 102 connected.

Figure 6B:
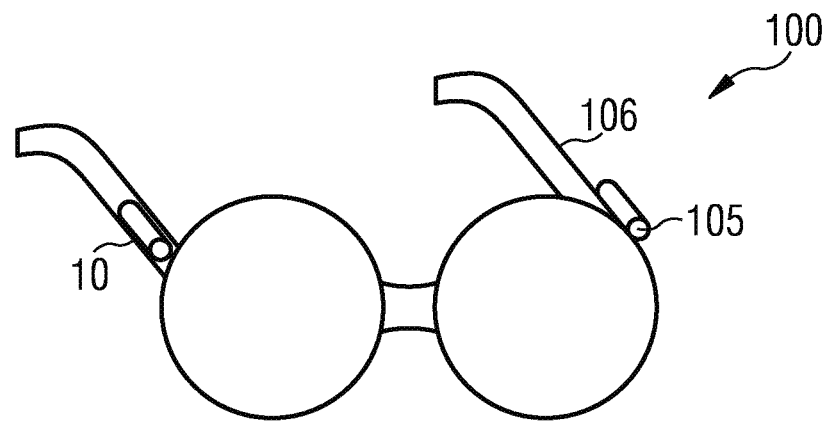

FIG. 6B shows a further example of the camera 100 which is a further development of the embodiment shown in FIG. 6A. The camera 100 comprises a further image sensor 105 that is realized such as the image sensor 10. The camera 100 is configured as a stereo vision system. The image sensor 10 and the further image sensor 105 may be attached on a glasses frame 106. The camera 100 may comprise a further lens attached to the further image sensor 105.

Figure 7A:
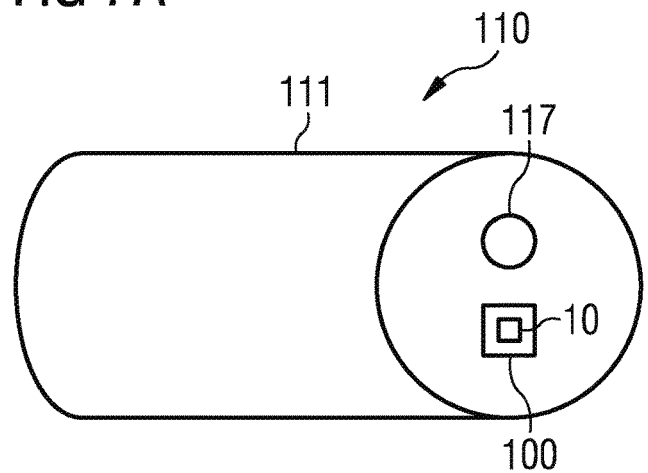
FIGS. 7A to 7F show examples of an apparatus with a camera.

FIG. 7A shows an example of an apparatus 110 with a camera 100 as shown in FIG. 6A or 6B. The apparatus 110 comprises the camera 100. Thus, the apparatus 110 includes the image sensor 10 as elucidated above. The apparatus 110 is realized as an endoscope 111. In FIG. 7A, a tip of the endoscope 111 is shown. The endoscope 111 comprises a light source 117 such as a glass fiber. Thus, the CIS 10 is integrated in a camera-on-tip endoscope, e.g. used in medical field.

Figure 7B:
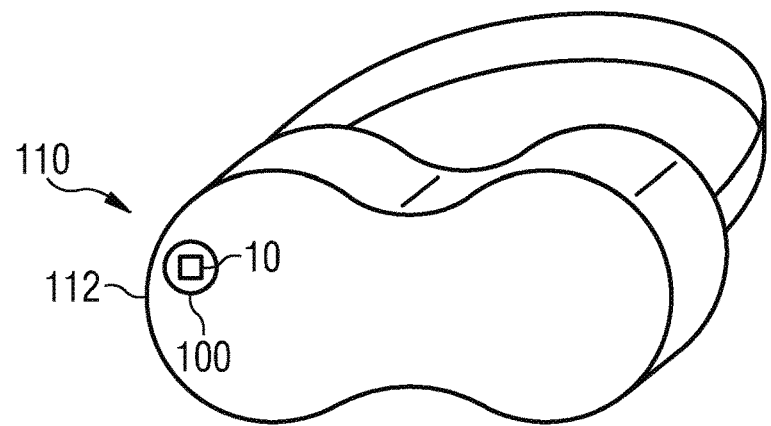

FIG. 7B shows a further example of the apparatus 110 with a camera 100 as shown in FIG. 6A or 6B which is a further development of the embodiments shown in the Figures above. The apparatus 110 is realized as a headset 112. The headset 112 may comprise the further image sensor 105 (not shown).

The headset 112 may be implemented as virtual reality/artificial reality headset (abbreviated VR/AR headset). The camera 100 can be integrated in the VR/AR headset 112, e.g. for eye tracking.

Figure 7C:
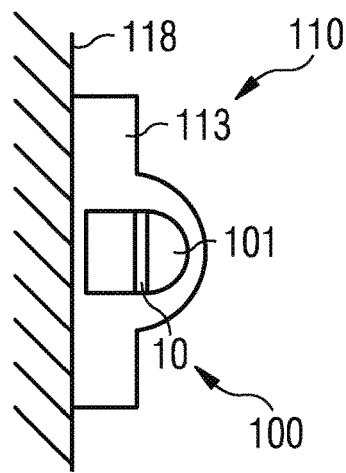

FIG. 7C shows a further example of the apparatus 110 with a camera as shown in FIG. 6A or 6B which is a further development of the embodiments shown in the Figures above. The apparatus 110 is realized as an entrance control device 113. The apparatus 110 may be attached to a wall 118.

Figure 7D:
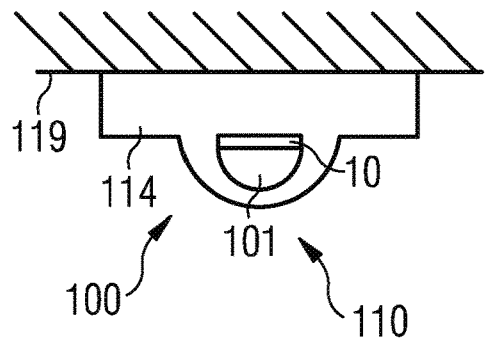

FIG. 7D shows a further example of the apparatus 110 with a camera 100 as shown in FIG. 6A or 6B which is a further development of the embodiments shown in the Figures above. The apparatus 110 is realized as a home automation device 114. The apparatus 110 may be attached to a ceiling 119.

The camera 100 may be configured for presence detection, such as e.g. entrance control, monitoring of public areas or home automation.

Figure 7E:
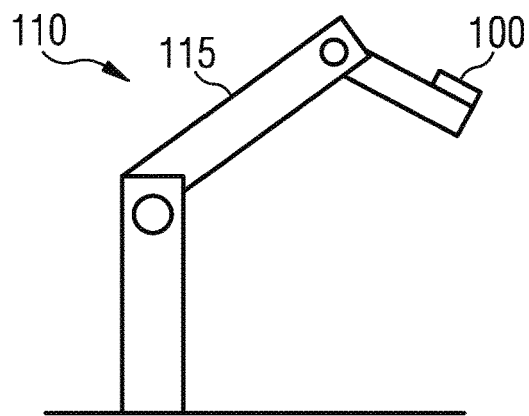

FIG. 7E shows a further example of the apparatus 110 with a camera 100 as shown in FIG. 6A or 6B which is a further development of the embodiments shown in the Figures above. The apparatus 110 is realized as a robot 115. The camera 100 has low-weight and small form factor. Thus, the camera 100 is applied for a moving tip of the robot 115 such as a pick-and-place machine.

Figure 7F:
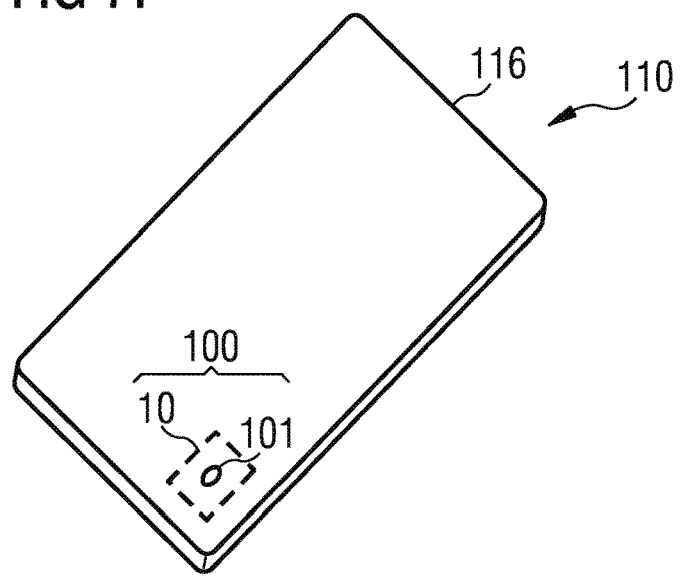

FIG. 7F shows a further example of the apparatus 110 with a camera 100 as shown in FIG. 6A or 6B which is a further development of the embodiments shown in the Figures above. The apparatus 110 is realized as a mobile device 116.

The mobile device 116 may comprise two cameras 100 for stereo vision systems and/or determining depths information. The apparatus may comprise a source generating structured light, such as a projector. The mobile device may be configured for telecommunication.

Thus, the image sensor 10 can be realized as an area saving, cost saving small CIS without degrading the performance of the pixels.

The embodiments shown in the FIGS. 1 to 7F as stated represent exemplary embodiments of the improved image sensor, therefore they do not constitute a complete list of all embodiments according to the improved image sensor, the camera and the apparatus. Actual configurations of the image sensor, the camera and the apparatus may vary from the embodiments shown in terms of shape, size and materials, for example.

The invention claimed is:

1. An image sensor, comprising:
an array comprising rows and columns of pixels;
a first number N of connection lines connected to a first number N of pixels of the array;
a voltage regulating circuit having an output;
a first terminal; and
a driver circuit having a first number N of switches coupled to the first number N of connection lines and to the output of the voltage regulating circuit, and a first number N of further switches coupled to the first number N of connection lines and to the first terminal,
wherein the first number N is at least two,
wherein the first number N of connection lines are at least temporarily configured as buffer capacitor of the voltage regulating circuit.

2. The image sensor of claim 1,
wherein the image sensor is realized as a complementary metal-oxide-semiconductor, CMOS, image sensor.

3. The image sensor of claim 1,
wherein the pixel comprises:
a photodiode;
a transfer transis;
a sense node coupled to the photodiode via the transfer transistor;
a reset transistor; and
a supply input coupled to the sense node via the reset transistor,
wherein a connection line of the first number N of connection lines is connected to a control terminal of the transfer transistor or to a control terminal of the reset transistor.

4. The image sensor of claim 1,
wherein a majority of the first number N of switches is set in a conducting state at any point in time during operation of the image sensor, wherein the first number N is at least three.

5. The image sensor of claim 1,
wherein the driver circuit comprises a control circuit configured
to set the first number N of switches in a conducting state and the first number N of further switches in a non-conducting state in a first operation phase and
to set a subset of the first number N of switches in a non-conducting state, the other of the first number N of switches in a conducting state, the subset of the first number N of further switches in a conducting state and the other of the first number N of further switches in a non-conducting state in a second operation phase.

6. The image sensor of claim 1,
wherein the voltage regulating circuit comprises a charge pump with an output that is connected to the output of the voltage regulating circuit.

7. The image sensor of claim 6,
comprising:
a multiplexer coupled to the array; and
a clock generator coupled to the charge pump and to the multiplexer.

8. The image sensor of claim 7,
comprising an analog-to-digital converter,
wherein a column line of the array is coupled via the multiplexer to the analog-to-digital converter, and
wherein a clock signal generated by the clock generator is provided to the charge pump and to the multiplexer.

9. The image sensor of claim 1,
comprising a reference potential terminal at which a reference potential can be tapped,
wherein the voltage regulating circuit is configured to generate an output voltage that is negative with respect to the reference potential.

10. The image sensor of claim 1,
comprising a supply terminal at which a supply voltage can be tapped,
wherein the voltage regulating circuit is configured to generate an output voltage that is positive with respect to the supply voltage.

11. The image sensor of claim 1,
wherein the voltage regulating circuit is free of a discrete capacitor coupling the output of the voltage regulating circuit to a reference potential terminal.

12. The image sensor of claim 1,
wherein the first number N of connection lines run parallel to a first number N of rows,
wherein the driver circuit is realized as a row driver circuit, and
wherein the first terminal is coupled to a supply terminal at which a supply voltage (VDD) is tapped.

13. A camera, comprising
the image sensor of claim 1 and
a lens attached to the image sensor.

14. The camera of claim 13,
comprising a further image sensor of claim 1,
wherein the camera is configured as a stereo vision system.

15. An apparatus,
comprising the camera of claim 13, wherein the apparatus is realized as one of a group comprising an endoscope, a headset, an entrance control device, a home automation device, a robot and a mobile device.

16. An image sensor, comprising:
an array comprising rows and columns of pixels;
a first number N of connection lines connected to a first number N of pixels of the array;
a voltage regulating circuit having an output wherein the voltage regulating circuit comprises a charge pump with an output that is connected to the output of the voltage regulating circuit;
a first terminal;
a driver circuit having a first number N of switches coupled to the first number N of connection lines and to the output of the voltage regulating circuit, and a first number N of further switches coupled to the first number N of connection lines and to the first terminal,
a multiplexer coupled to the array; and
a clock generator coupled to the charge pump and to the multiplexer,
wherein the first number N is at least two.

17. An image sensor, comprising:
an array comprising rows and columns of pixels;
a first number N of connection lines connected to a first number N of pixels of the array;
a voltage regulating circuit having an output;
a first terminal; and
a driver circuit having a first number N of switches coupled to the first number N of connection lines and to the output of the voltage regulating circuit, and a first number N of further switches coupled to the first number N of connection lines and to the first terminal,
wherein the first number N is at least two, and
wherein the image sensor further comprises a reference potential terminal at which a reference potential can be tapped and the voltage regulating circuit is configured to generate an output voltage that is negative with respect to the reference potential, or the image sensor further comprises a supply terminal at which a supply voltage can be tapped and the voltage regulating circuit is configured to generate an output voltage that is positive with respect to the supply voltage.

* * * * *